United States Patent [19]

Lanzisera

[11] Patent Number: 4,744,625

[45] Date of Patent: May 17, 1988

[54] METHODS OF AND APPARATUS FOR PROVIDING FREQUENCY MODULATED LIGHT

[75] Inventor: Vincent A. Lanzisera, Northboro, Mass.

[73] Assignee: GTE Laboratories Incorporated, Waltham, Mass.

[21] Appl. No.: 430,585

[22] Filed: Sep. 30, 1982

[51] Int. Cl.$^4$ .......................... G02B 6/00; G02B 6/36; G02B 6/02; H04R 17/00

[52] U.S. Cl. .................. 350/96.20; 350/358; 350/96.29; 350/96.10; 367/140

[58] Field of Search ............... 350/96.10, 96.20, 96.29, 350/358, 360; 367/140, 141, 149

[56] References Cited

U.S. PATENT DOCUMENTS

| | | | |
|---|---|---|---|
| 3,243,722 | 3/1966 | Billings | 331/94.5 |
| 3,379,887 | 4/1968 | Stephany | 250/199 |
| 3,434,776 | 3/1969 | Kern | 350/96 |
| 3,590,681 | 7/1971 | Cross | 84/464 |
| 3,700,900 | 10/1972 | Herleikson | 250/199 |
| 3,705,992 | 12/1972 | Ippen et al. | 307/88.3 |
| 3,800,906 | 4/1974 | Albares | 181/0.5 NP |
| 3,982,817 | 9/1976 | Feichtner | 350/149 |
| 4,105,915 | 4/1978 | Clay et al. | 250/199 |
| 4,236,243 | 11/1980 | Davies et al. | 370/3 |
| 4,310,905 | 1/1982 | Palmer | 367/149 X |
| 4,320,475 | 3/1982 | Leclerc et al. | 367/140 X |
| 4,363,114 | 12/1982 | Bucaro et al. | 367/149 |

Primary Examiner—William L. Sikes
Assistant Examiner—Akm E. Ullah
Attorney, Agent, or Firm—Fred Fisher

[57] ABSTRACT

Frequency modulated light is provided to an optical fiber by exciting a laser medium, such as a diode laser, so that stimulated emitted radiation, at a fixed wavelength $\lambda$, emanates from opposite surfaces of the medium. One end of the fiber is coupled to one of the surfaces. A reflecting medium is provided a distance $(n\lambda)/4$ away from the other of the surfaces (n being a positive integer) to reflect emanated radiation from the other surface back to the other surface. The reflecting medium is oscillated in accordance with a signal to be modulated. The radiation reflected back to the other surface tends to cancel or reinforce, respectively, the radiation that emanates from the one surface, when n is an odd integer or an even integer, respectively. The reflecting medium can be a light reflecting diaphragm adapted to be acoustically oscillated.

9 Claims, 1 Drawing Sheet

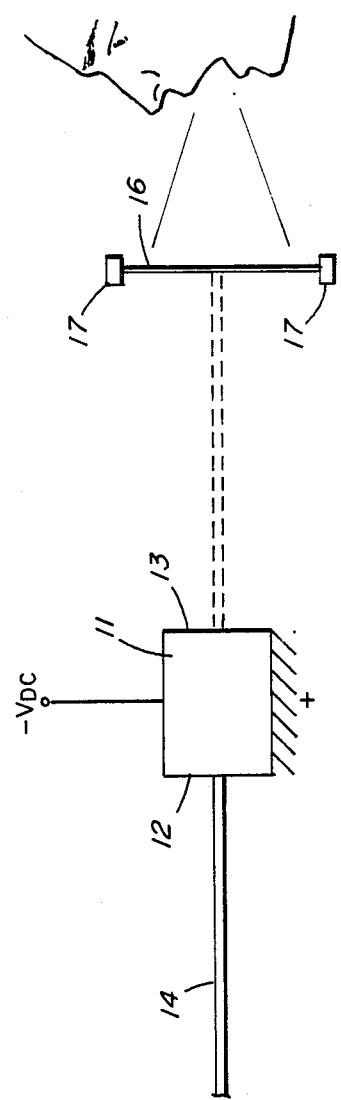

METHODS OF AND APPARATUS FOR PROVIDING FREQUENCY MODULATED LIGHT

BACKGROUND OF THE INVENTION

1. Field of the Invention

This invention relates to methods of and apparatus for providing frequency modulated light. Accordingly, it is a general object of this invention to provide new and improved methods and apparatus of such character.

2. General Background

It has been suggested in the prior art to direct a laser beam upon a reflective diaphragm subject to vibration by reason of a sound signal. The laser beam is thus reflected onto an appropriate screen whereby distinctive patterns may be viewed.

SUMMARY OF THE INVENTION

Another object of this invention is to provide new and improved methods of and apparatus for providing frequency modulated light along an optical fiber.

Still another object of this invention is to provide new and improved methods of and apparatus for acoustically modulating the output of a diode laser.

Yet another object of this invention is to provide new and improved methods of and apparatus for transmitting vibrational signals along an optical path.

Still yet another object of this invention is to provide new and improved methods of and apparatus for frequency modulating a diode laser.

Yet still another object of this invention is to provide new and improved methods of and apparatus for varying the lasing frequency of a diode laser at a rate that coincided with a light reflective diaphragm being changed by sound, vibration, or movement.

In accordance with one aspect of the invention, frequency modulated light is provided to an optical fiber by exciting a lasing medium so that stimulated emitted radiation at a fixed wavelength $\lambda$ emanates from opposite surfaces of the medium. One end of the fiber is coupled to a first one of the opposite surfaces. A reflecting medium is provided a distance $(n\lambda/4)$ away from the other (a second) of the opposite surfaces to reflect emanated radiation from the second surface back to said second surface. The reflected medium is oscillated in accordance with a signal to be modulated. However, in accordance with certain features of the invention, n is an odd positive integer whereby radiation reflected back to the second surface tends to cancel the radiation that emanates from the first surface. With other features of the invention, n is an even positive integer whereby radiation reflected back to the second surface tends to reinforce the radiation that emanates from the first surface. The reflecting medium can be acoustically oscillated.

In accordance with another aspect of the invention, apparatus for providing frequency modulated light to an optical fiber includes a lasing medium which can be excited so that stimulated emitted radiation emanates from opposed surfaces of the medium at a fixed wavelength $\lambda$. One end of an optical fiber is coupled to one of the opposed surfaces. Radiation reflecting means, such as a light reflecting diaphragm adapted to be acoustically oscillated, is displaced a distance $(n\lambda/4)$ away from the other of the opposed surfaces for reflecting emanated radiation from the other surface back to said other surface. The reflecting means is adapted to be oscillated in accordance with a signal to be modulated.

In accordance with certain features of the invention, the lasing medium can be a laser diode. The radiation reflecting means can be a light reflecting diaphragm adapted to be acoustically oscillated n can be an odd positive integer whereby radiation reflected back to the other surface tends to cancel the radiation that emanates from the one surface. Also, n can be an even positive integer whereby radiation reflected back to the other surface tends to reinforce the radiation that emanates from the one surface.

BRIEF DESCRIPTION OF THE DRAWINGS

Other objects, advantages, and features of this invention, together with its construction and mode of operation, will become more apparent from the following description, when read in conjunction with the accompanying drawing, in which the sole figure is a diagram illustrating an embodiment of the invention.

DESCRIPTION OF PREFERRED EMBODIMENT

Referring to the drawing, a diode laser 11 is excited by providing the appropriate biasing potential thereto. As depicted in the drawing, the upper surface of the diode laser is coupled to a negative voltage source, $-V_{dc}$, while the lower surface is coupled to a point of reference potential, such as ground. When properly biased, the laser diode 11 is adapted to lase, or emit stimulated emission, at a fixed wavelength $\lambda$, depending upon its characteristics (material, dimension, etc.).

The stimulated emission emanates and radiates from two opposed facets 12, 13. The front facet 12 is coupled to one end of an optical fiber 14. The rear facet 13 is unobstructed.

A light reflecting diaphragm 16, such as a thin plastic membrane coated with a metallic layer of aluminum, is supported by suitable means 17—17 a distance $(n\lambda/4)$ from the rear facet 13 of the laser diode 11. The diaphragm 16 is so oriented that light radiating from the laser diode facet 13 is reflected back to the same facet 13, affecting the electrical reactance of the cavity of the laser diode 11.

When the diaphragm 16 is positioned a distance equal to an odd number of quarter wavelengths from the laser diode 11, the reflected light, upon again arriving at the rear facet 13, will have travelled an odd number of half wavelengths, thus tending to cancel the radiation that emanates from the front facet 12 of the laser diode 11 onto the fiber 14. Sound impinged upon the diaphragm 16 tends to be translated into a burst of signals commensurate with the audio input.

Contrariwise, when the diaphragm 16 is oriented a distance equal to an even number of quarter wavelengths from the laser diode 11, the reflected light, upon again arriving at the rear facet 13, will have travelled an integral number of full wavelengths, thus tending to reinforce the radiation that emanates from the front facet 12 of the laser diode 11 onto the fiber 14. Thus, sound impinged upon the diaphragm 16 frequency modulates an amplified laser signal in the laser diode 11.

Thus, a diode laser 11 can be easily frequency modulated by changing its lasing frequency at a rate which coincides with the light reflective diaphragm 16 being changed by sound, vibration, or movement.

Effectively, a resonant cavity exists between the laser diode 11 and the reflecting diaphragm 16. When sound impinges upon the diaphragm 16, the diaphragm 16 vibrates at the sound rate, changing the frequency of lasing at that rate, thereby frequency modulating the diode laser 11.

Various modifications can be performed without departing from the spirit and scope of this invention. For example, the diaphragm 16 can be used to detect vibrations such as building or mechanical vibrations, and thus sense ground eruptions and earthquakes. Hence, such disturbances can be measured at a receiver distant from the diode laser 11.

What is claimed is:

1. A method of providing frequency modulated light to an optical fiber comprising the steps of exciting a lasing medium so that stimulated emitted radiation at a fixed wavelength $\lambda$ emanates from opposite surfaces thereof;

coupling one end of said optical fiber to one of said surfaces;

providing a reflecting medium a distance $n\lambda/4$ away from the other of said surfaces to reflect emanated radiation from said other surface back to said other surface; and oscillating said reflecting medium in accordance with a signal to be modulated;

wherein n is a positive integer.

2. The method as recited in claim 1 wherein n is an odd positive integer whereby radiation reflected back to said other surface tends to cancel said radiation that emanates from said one surface.

3. The method as recited in claim 1 wherein n is an even positive integer whereby radiation reflected back to said other surface tends to reinforce said radiation that emanates from said one surface.

4. The method as recited in claim 1 wherein said reflecting medium is acoustically oscillated.

5. Apparatus for providing frequency modulated light to an optical fiber comprising a lasing medium having opposed surfaces;

means for exciting said medium so that stimulated emitted radiation emanates from said opposed surfaces at a fixed wavelength $\lambda$;

an optical fiber having one end coupled to one of said opposed surfaces; and radiation reflecting means displaced a distance $(n\lambda/4)$ away from the other of said opposed surfaces for reflecting emanated radiation from said other surface back to said other surface, said reflecting means being adapted to be oscillated in accordance with a signal to be modulated;

wherein n is a positive integer.

6. The apparatus as recited in claim 5 wherein said lasing medium is a diode laser.

7. The apparatus as recited in claim 6 wherein n is an odd positive integer whereby radiation reflected back to said other surface tends to cancel said radiation that emanates from said one surface.

8. The apparatus as recited in claim 6 wherein n is an even positive integer whereby radiation reflected back to said other surface tends to reinforce said radiation that emanates from said one surface.

9. The apparatus as recited in claim 5 wherein said radiation reflecting means is a light reflecting diaphragm adapted to be acoustically oscillated.

* * * * *